(12) United States Patent
Di Sarro et al.

(10) Patent No.: US 9,219,055 B2
(45) Date of Patent: Dec. 22, 2015

(54) STRUCTURE AND METHOD FOR DYNAMIC BIASING TO IMPROVE ESD ROBUSTNESS OF CURRENT MODE LOGIC (CML) DRIVERS

(75) Inventors: James P. Di Sarro, Essex, VT (US); Robert J. Gauthier, Jr., Hinesburg, VT (US); Nathan D. Jack, Hillsboro, OR (US); Jun Jun Li, Williston, VT (US); Souvick Mitra, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 861 days.

(21) Appl. No.: 13/517,849

(22) Filed: Jun. 14, 2012

(65) Prior Publication Data

US 2013/0335099 A1    Dec. 19, 2013

(51) Int. Cl.
*H03K 19/086* (2006.01)
*H03K 19/0175* (2006.01)
*H01L 27/02* (2006.01)

(52) U.S. Cl.
CPC .................................. *H01L 27/0251* (2013.01)

(58) Field of Classification Search
CPC ............. H01L 27/0251; H03K 19/086; H03K 19/0175
USPC .................... 326/82, 83, 23, 86, 127; 361/56; 257/355
See application file for complete search history.

(56) References Cited

U.S. PATENT DOCUMENTS

| | | | |
|---|---|---|---|
| 6,005,414 A * | 12/1999 | Reay | 326/83 |
| 6,400,541 B1 | 6/2002 | Brett | |
| 6,417,708 B1 * | 7/2002 | Fiedler | 327/170 |
| 6,690,561 B2 | 2/2004 | Hung et al. | |
| 6,693,780 B2 | 2/2004 | Spehar et al. | |
| 6,747,501 B2 | 6/2004 | Ker et al. | |
| 6,898,061 B1 | 5/2005 | Kimber et al. | |
| 7,072,161 B2 | 7/2006 | Chen | |
| 7,286,331 B2 | 10/2007 | Choi | |
| 7,304,506 B2 | 12/2007 | Hangaishi | |
| 7,471,110 B2 | 12/2008 | Dixit et al. | |
| 7,532,037 B1 | 5/2009 | Granados et al. | |
| 7,560,957 B2 | 7/2009 | Chen et al. | |
| 7,586,721 B2 | 9/2009 | Wang et al. | |
| 7,826,188 B2 | 11/2010 | Gauthier, Jr. et al. | |
| 7,903,380 B2 | 3/2011 | Jing et al. | |
| 2009/0310267 A1 | 12/2009 | Gauthier, Jr. et al. | |
| 2010/0246078 A1 | 9/2010 | Utagawa et al. | |
| 2011/0026175 A1 | 2/2011 | Ker et al. | |

* cited by examiner

*Primary Examiner* — Daniel D Chang
(74) *Attorney, Agent, or Firm* — Gibb & Riley, LLC; David A. Cain, Esq.

(57) ABSTRACT

An integrated circuit having a CML driver including a driver biasing network. A first output pad and a second output pad are connected to a voltage pad. A first driver is connected to the first output pad and the voltage pad. A second driver is connected to the second output pad and the voltage pad. A first ESD circuit is connected to the voltage pad, the first output pad, and the first driver. A second ESD circuit is connected to the voltage pad, the second output pad, and the second driver. The first ESD circuit biases the first driver toward a voltage of the voltage pad when an ESD event occurs at the first output pad, and the second ESD circuit biases the second driver toward the voltage of the voltage pad when an ESD event occurs at the second output pad.

20 Claims, 8 Drawing Sheets

PADN to PADP:

| TXN | TXP | BIAS TOP | BIAS BOT | $V_{fail}$ | Failure location |
|---|---|---|---|---|---|
| PADN/2 | 0V | Off | Off | 5.2-5.5 | TXN D-S/TXP D-S |
| PADN | 0V | X | X | 3.27 | TXP D-S |
| X | 1.2V | X | X | 2.9 | TXN D-S |

STRUCTURE AND METHOD FOR DYNAMIC BIASING TO IMPROVE ESD ROBUSTNESS OF CURRENT MODE LOGIC (CML) DRIVERS

BACKGROUND

The present disclosure relates to Integrated Circuits for current mode logic drivers to improve electrostatic discharge (ESD) protection.

For high-speed differential operation in the GHz range, current mode logic (CML) drivers are typically used for their large attainable bandwidth. These are simple resistively loaded differential amplifiers. As technology scales supply voltage, transistor threshold voltage, breakdown voltage reduces. The lower breakdown voltage of the devices makes them susceptible to the electrostatic discharge (ESD) stress. Lower threshold voltages of the transistors make them conduct large current at small overdrive voltages. This current can exceed the current limit of the salicided driver transistor, leading to failures. Methods are needed for increasing the ESD design window without adding significant ESD device capacitance or area. Unfortunately, decreased ESD window as technology scales smaller leads to increased ESD device area and capacitance. Furthermore, increasing signaling speeds decreases the capacitance budgets at transceivers.

Recently, failure of driver NFETs was discovered in the CML driver topology during pad-to-pad or pad-to-ground electrostatic discharge (ESD) stress. It has been observed that during pad-to-pad ESD stress, one of the driver transistors of the CML driver turns on putting the entire ESD stress across its partner (the other driver transistor of the CML driver). In a CML driver structure, an ESD zap is applied at one pad and ground connection is applied to the other pad to create an ESD stress test. In operation, one of the drivers of the CML driver structure turns on, discharging the current mode (CM) node of the CML driver to 0V. This puts most of the ESD stress on its partner device, which can cause drain-source shorting on the partner driver transistor, leading to ESD failures.

Conventional technologies, such as shown in FIG. 1, provide a circuit that includes an RC clamp. In some prior circuits, such as for ESD protection for high-speed receiver circuits, a biasing circuits attempts to prevent oxide breakdown in a receiver by increasing source impedance. The tail current source may be disabled by the bias network. In another prior circuit that uses biasing to prevent drain breakdown, the circuit increases allowable pad voltages during an output-to-output stress by preventing drain breakdown using a bias network. A problem with this circuit is that it decreases allowable pad voltage for output-to-Vss stress.

SUMMARY

According to one embodiment herein, a current mode logic (CML) driver is disclosed. The CML driver includes a driver biasing network. A first output pad is connected to a voltage pad. A second output pad is connected to the voltage pad. A first driver is connected to the first output pad and the voltage pad. A second driver is connected to the second output pad and the voltage pad. A first electrostatic discharge (ESD) circuit is connected to the voltage pad, the first output pad, and the first driver. A second ESD circuit is connected to the voltage pad, the second output pad, and the second driver. The first ESD circuit dynamically biases the first driver toward a voltage of the voltage pad and a voltage of the first output pad when an ESD event occurs at the first output pad, and the second ESD circuit dynamically biases the second driver toward the voltage of the voltage pad and a voltage of the second output pad when an ESD event occurs at the second output pad.

According to another embodiment herein, an integrated circuit is disclosed. The integrated circuit comprises a current mode logic (CML) driver. A first output pad is connected to a first voltage pad. A second output pad is connected to the first voltage pad. A first driver is connected to the first output pad and the first voltage pad. A second driver is connected to the second output pad and the first voltage pad. A first pre-amplifier is connected to the first driver. A second pre-amplifier is connected to the second driver. A first transistor is connected to the first pre-amplifier and the first voltage pad. A second transistor is connected to the second pre-amplifier and the first voltage pad. A first ESD-controlled inverter is connected to a gate of the first transistor. A second ESD-controlled inverter is connected to a gate of the second transistor. The first ESD controlled inverter dynamically biases the first transistor to disconnect the first pre-amplifier from the first voltage pad when an ESD event occurs at the first output pad, and the second ESD controlled inverter dynamically biases the second transistor to disconnect the second pre-amplifier from the first voltage pad when an ESD event occurs at the second output pad.

According to another embodiment herein, a pre-amplifier disconnection network is disclosed. The disconnection network comprises a pre-amplifier connected to a driver. A pass gate comprises a PFET device connected in parallel to an NFET device. The pass gate is located between an output of the pre-amplifier and an input to the driver. An ESD clamp circuit is connected between an output pad and a voltage pad. The ESD clamp circuit provides a first control signal to the PFET device when an ESD event occurs at the output pad. The ESD clamp circuit provides a second control signal to the NFET device when an ESD event occurs at the output pad.

BRIEF DESCRIPTION OF THE DRAWINGS

The embodiments herein will be better understood from the following detailed description with reference to the drawings, which are not necessarily drawing to scale and in which.

DETAILED DESCRIPTION

Embodiments described herein increase the maximum allowed clamping voltage at output pads and improve robustness of the circuit for multiple ESD zap combinations. The ESD bias network for CML drivers described herein optimally adjusts biasing of the CML circuit depending on where current enters and exits the circuit.

In general, the technique is to pull the gate of a zapped drain toward the power bus potential but not all the way to the zap pad potential. If the drain is grounded, its gate is pulled toward 0V, and the tail devices are kept off for all zaps.

Figure 1:
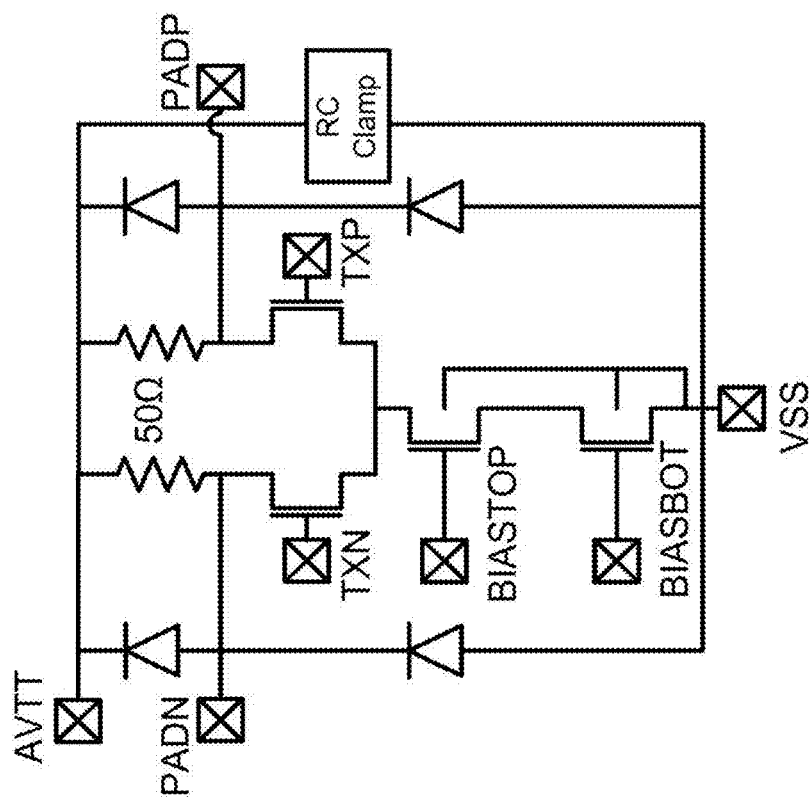
FIG. 1 is a schematic diagram illustrating typical ESD protection of a CML Driver.
Figure 2:
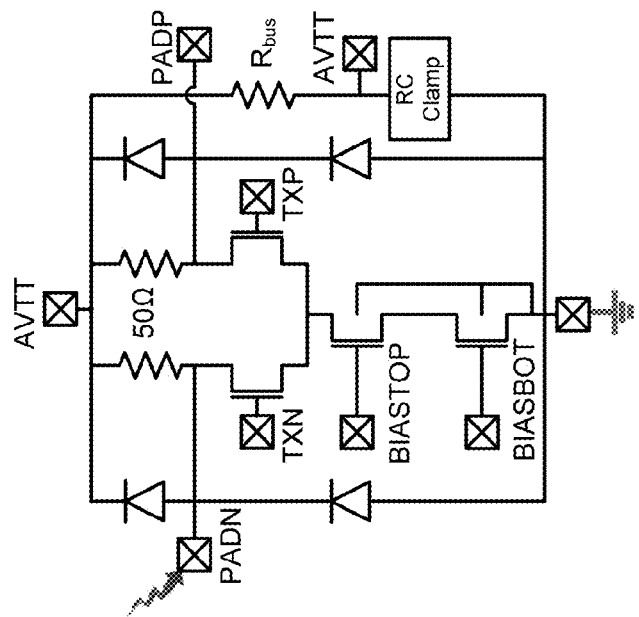
FIG. 2 is a schematic diagram illustrating embodiments herein.

FIG. 2 shows an example where an ESD zap is applied at one pad, labeled PADN, and the bottom connection is grounded. In this case, it is desirable to pull up the transistor TXN gate voltage to avoid gate oxide over-voltage in this device. (If the PADP pad was zapped, it would be desirable to pull up the TXP transistor's gate voltage.) It is also desirable to keep at least one of the tail devices (devices with gates labeled BIASTOP and BIASBOT) off.

Figure 3:
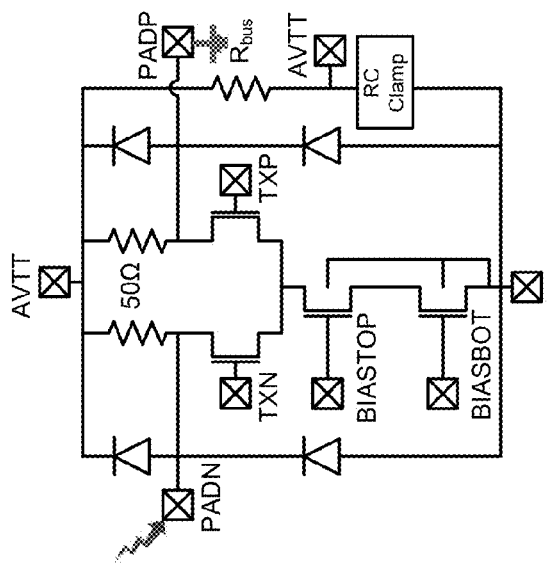
FIG. 3 is a schematic diagram illustrating embodiments herein.

FIG. 3 shows an example where an ESD zap is applied at one pad, labeled PADN, and a ground connection is applied to the PADP pad. In this case, it is desirable to pull up the gate of transistor TXN, up near AVTT, but not all the way up to PADN. Additionally, pull the TXP transistor gate voltage to 0V. (If the PADP pad was zapped, it would be desirable to pull the TXP driver up near AVTT and the TXN transistor's gate voltage to 0V.) In either event, it is desirable to keep the tail devices (BIASTOP and BIASBOT) off.

Figure 4:
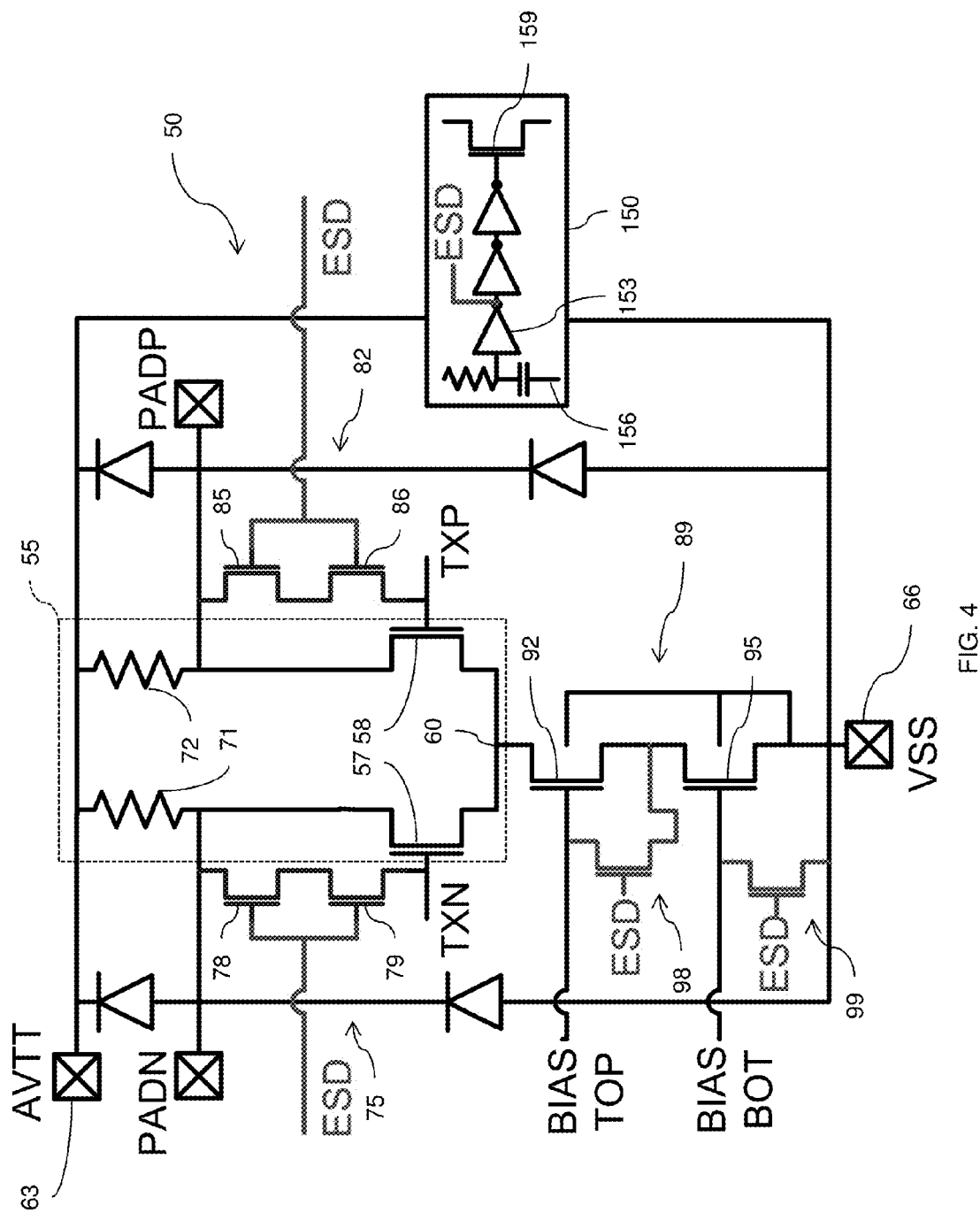
FIG. 4 is a schematic diagram illustrating embodiments herein.

For a better understanding of an embodiment and its operation, turning now to the drawings, FIG. 4 is a schematic circuit diagram of an integrated circuit 50 having current mode logic (CML) driver topology in accordance with one exemplary embodiment. The integrated circuit 50 includes a differential driver 55 comprising a first driver 57 (TXN), a second driver 58 (TXP), and a bias node 60. The first driver 57 (TXN) and the second driver 58 (TXP) are coupled in parallel between a power supply pad 63 (AVTT) and a ground pad 66 (Vss). The bias node 60 is coupled between the first driver 57 (TXN) and the second driver 58 (TXP). In accordance with one non-limiting exemplary embodiment, the first driver 57 (TXN) and the second driver 58 (TXP) are NFETs.

The integrated circuit 50 further includes resistors 71 and 72. In accordance with one exemplary embodiment, resistor 71 is coupled between the power supply pad 63 (AVTT) and pad PADN, and resistor 72 is coupled between the power supply pad 63 (AVTT) and pad PADP. Pads PADN and PADP are correspondingly coupled to the first driver 57 (TXN) and the second driver 58 (TXP), respectively. The resistors 71, 72 can each include any resistive value depending on the application. In accordance with one non-limiting exemplary embodiment, the resistors each have a resistive value of about 50 ohms.

The integrated circuit 50 further includes a first electrostatic discharge (ESD) circuit 75 having a pair of MOS transistors 78, 79 and a second electrostatic discharge (ESD) circuit 82 having a pair of MOS transistors 85, 86. In one non-limiting exemplary embodiment, the MOS transistors (78, 79, 85, 86) are each NFETs. The first pair of MOS transistors 78, 79 is coupled between the first driver 57 (TXN) and pad PADN. The first ESD circuit 75 dynamically biases the first driver 57 (TXN) toward the voltage of the power supply pad 63 (AVTT) and the voltage of pad PADN when an ESD event occurs at pad PADN. The second pair of MOS transistors 85, 86 is coupled between the second driver 58 (TXP) and pad PADP. The second ESD circuit 82 dynamically biases the second driver 58 (TXP) toward the voltage of the power supply pad 63 (AVTT) and a voltage of pad PADP when an ESD event occurs at pad PADP.

In accordance with one exemplary embodiment, the gates of the first pair of MOS transistors 78, 79 and the second pair of MOS transistors 85, 86 are controlled by an ESD event at their respective pads PADN, PADP. During an ESD event at pad PADN, the high voltage from the ESD event turns on both the first pair of MOS transistors 78, 79, which pull up the gate of the first driver 57 (TXN) to a voltage slightly below the voltage of the power supply pad 63 (AVTT). This causes the first driver 57 (TXN) to turn on and pull up the voltage of the bias node 60 to an intermediate voltage below that of the power supply pad 63 (AVTT). At the same time, the second pair of MOS transistors 85, 86 turn on and pull the gate of the second driver 58 (TXP) to near the voltage of pad PADP.

During an ESD event at pad PADP, the high voltage from the ESD event turns on both the second pair of MOS transistors 85, 86, which pull up the gate of the second driver 58 (TXP) to a voltage slightly below the voltage of the power supply pad 63 (AVTT). This causes the second driver 58 (TXP) to turn on and pull up the voltage of the bias node 60 to an intermediate voltage below that of the power supply pad 63 (AVTT). At the same time, the first pair of MOS transistors 78, 79 turn on and pull the gate of the first driver 57 (TXN) to near the voltage of pad PADN.

This combination of voltages on the gates of the two drivers 57, 58 and the bias node 60 results in the optimal ESD window. Turning off the drivers reduces the voltage drop on the first driver 57 (TXN) and the second driver 58 (TXP), thereby preventing driver failures or damage to the drivers during an ESD event. During normal operation, the first pair of MOS transistors 78, 79 and the second pair of MOS transistors 85, 86 are kept off. In this case, the first driver 57 (TXN) and the second driver 58 (TXP) may be on.

The integrated circuit 50 further includes a driver biasing network 89. The driver biasing network 89 includes a top bias transistor 92 connected to a bottom bias transistor 95 and to the bias node 60. The bottom bias transistor 95 is connected to the top bias transistor 92 and to the ground pad 66 (Vss). In one non-limiting exemplary embodiment, the top bias transistor 92 and the bottom bias transistor 95 are each NFETs. A third ESD circuit 98 is connected to the top bias transistor 92 and to the bottom bias transistor 95. A fourth ESD circuit 99 is connected to the bottom bias transistor 95 and to the ground pad 66 (Vss).

During an ESD event at either pad PADP or pad PADN, the third ESD circuit 98 and the fourth ESD circuit 99 cause the voltage at the top and bottom bias transistors 92, 95 to be optimized to prevent damage to the top bias transistor 92 and bottom bias transistor 95, respectively.

Figure 5:
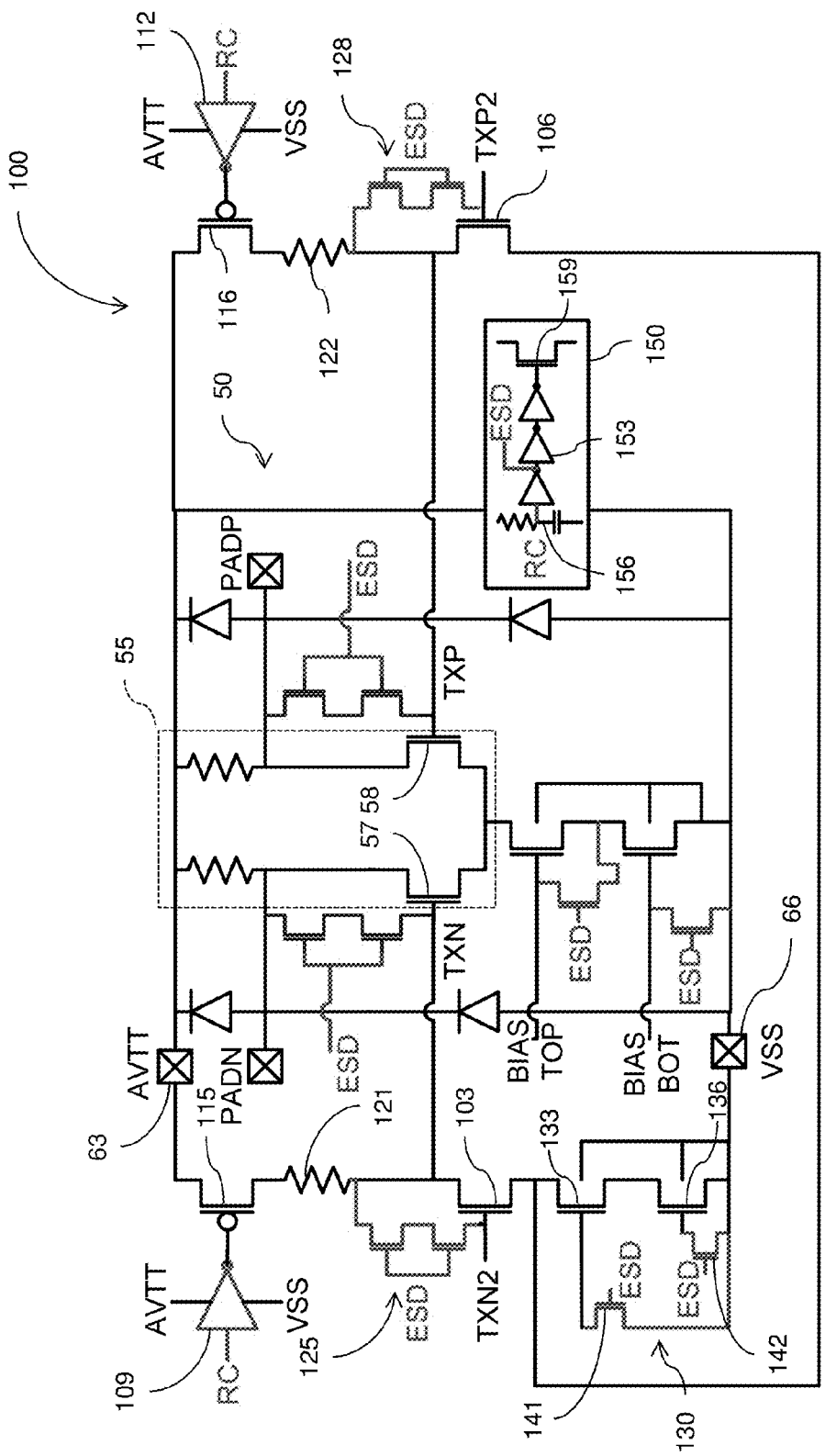
FIG. 5 is a schematic diagram illustrating embodiments herein.

FIG. 5 is a schematic circuit diagram of an integrated circuit 100 in accordance with another exemplary embodiment. This embodiment is a modification of the integrated circuit shown in FIG. 4. In this embodiment, pre-amplifiers are integrated in circuit 100 with the first driver 57 (TXN) and the second driver 58 (TXP). More specifically, a first pre-amplifier 103 (TXN2) and a second pre-amplifier 106 (TXP2) are integrated to circuit 100 to drive the first driver 57 (TXN) and the second driver 58 (TXP) respectively. In one non-limiting exemplary embodiment, the pre-amplifiers 103, 106 are NMOS devices. The drain of the first pre-amplifier 103 (TXN2) is connected to the drain of the second pre-amplifier 106 (TXP2) As will be apparent with the discussion below, the ESD protection circuit scheme can be co-designed to work for the circuits in FIGS. 4 and 5.

The integrated circuit 100 further includes a first ESD controlled inverter 109 and a second ESD controlled inverter 112 for turning the first pre-amplifier 103 (TXN2) and the second pre-amplifier 106 (TXP2) off during an ESD event in a similar fashion as described for the circuit in FIG. 4. Inverters 109 and 112 are connected to the gates of transistors 115, 116 respectively. Transistors 115, 116 are connected to the power supply pad 63 (AVTT). In one non-limiting exemplary embodiment, transistors 115, 116 are PMOS devices. The integrated circuit 100 further includes resistors 121 and 122.

In accordance with one exemplary embodiment, resistor 121 is coupled between the first pre-amplifier 103 (TXN2) and transistor 115, and resistor 122 is coupled between the second pre-amplifier 106 (TXP2) and transistor 116. The resistors 121, 122 can each include any resistive value depending on the application. In accordance with one non-limiting exemplary embodiment, the resistors each have a resistive value of about 50 ohms.

The first ESD controlled inverter 109 dynamically biases transistor 115 to disconnect the first pre-amplifier 103 (TXN2) from the power supply pad 63 (AVTT) when an ESD event occurs at pad PADN. The second ESD controlled inverter 112 dynamically biases transistor 116 to disconnect the second pre-amplifier 106 (TXP2) from the power supply pad 63 (AVTT) when an ESD event occurs at pad PADP.

The ESD-controlled inverters 109, 112 bias the transistors 115, 116, respectively to ensure the transistors 115, 116 are hard off during an ESD event, and hard on during normal operation.

The integrated circuit 100 further includes a fifth ESD circuit 125 having a pair of MOS transistors and a sixth ESD circuit 128 having a pair of MOS transistors. In one non-limiting exemplary embodiment, the MOS transistors of the fifth and sixth ESD circuits 125, 128 are each NFETs. The MOS transistors of the fifth ESD circuit 125 are coupled between the gate of the first pre-amplifier 103 (TXN2) and resistor 121. The MOS transistors of the sixth ESD circuit 128 are coupled between the gate of the second pre-amplifier 106 (TXP2) and resistor 122.

During an ESD event at pad PADN, the voltage from the ESD event turns off the pair of MOS transistors in the fifth ESD circuit 125, which effectively turns off the first pre-amplifier 103 (TXN2). During an ESD event at pad PADP, the voltage from the ESD event turns off the pair of MOS transistors in the sixth ESD circuit 128, which effectively turns off the second pre-amplifier 106 (TXP2). Turning off the pre-amplifiers reduces the voltage drop on the first pre-amplifier 103 (TXN2) and the second pre-amplifier 106 (TXP2), thereby preventing failure of the pre-amplifiers or damage to the pre-amplifiers during an ESD event. During normal operation, the MOS transistors in the fifth ESD circuit 125 and the MOS transistors in the sixth ESD circuit 128 are kept off. In this case, the first pre-amplifier 103 (TXN2) and the second pre-amplifier 106 (TXP2) may be on.

The integrated circuit 100 further includes a pre-amplifier biasing network 130. The driver biasing network 130 includes a top pre-amp bias transistor 133 connected to a bottom pre-amp bias transistor 136 and to the drains of the first pre-amplifier 103 (TXN2) and the second pre-amplifier 106 (TXP2). The bottom pre-amp bias transistor 136 is connected to the top pre-amp bias transistor 133 and to the ground pad 66 (Vss). In one non-limiting exemplary embodiment, the top pre-amp bias transistor 133 and the bottom pre-amp bias transistor 136 are each NFETs. A seventh ESD circuit 141 is connected to the top pre-amp bias transistor 133 and to the ground pad 66 (Vss). An eighth ESD circuit 142 is connected to the bottom pre-amp bias transistor 136 and to the ground pad 66 (Vss).

The pre-amplifier biasing network 130 is applied to pre-amplifiers 103, 106 (TXN2, TXP2) to prevent the pre-amplifiers from altering the intended biasing of driver 55.

During an ESD event, the seventh ESD circuit 141 and the eighth ESD circuit 142 cause the voltage at the top and bottom pre-amp bias transistors 133, 136 to be optimized to prevent damage to the top pre-amp bias transistor 133 and bottom pre-amp bias transistor 136, respectively.

FIGS. 4 and 5 show a power-rail clamp circuit 150 according to embodiments herein. The clamp circuit 150 includes an inverter network 153, an RC circuit 156, and a clamp device 159. The RC circuit 156 detects an ESD transient and generates the ESD control signals output from the inverter network 153. The turn-on duration of the ESD clamp device is mainly controlled by the RC time constant of the ESD-transient detection circuit 156. Consequently, the RC time constant would be designed large enough about several hundred nanoseconds to keep the ESD clamp device 159 at "ON" state under the ESD stress condition. The ESD control signals provide input to the various ESD circuits to optimally adjust biasing depending on where the ESD current enters and exits the circuit.

Figure 6:
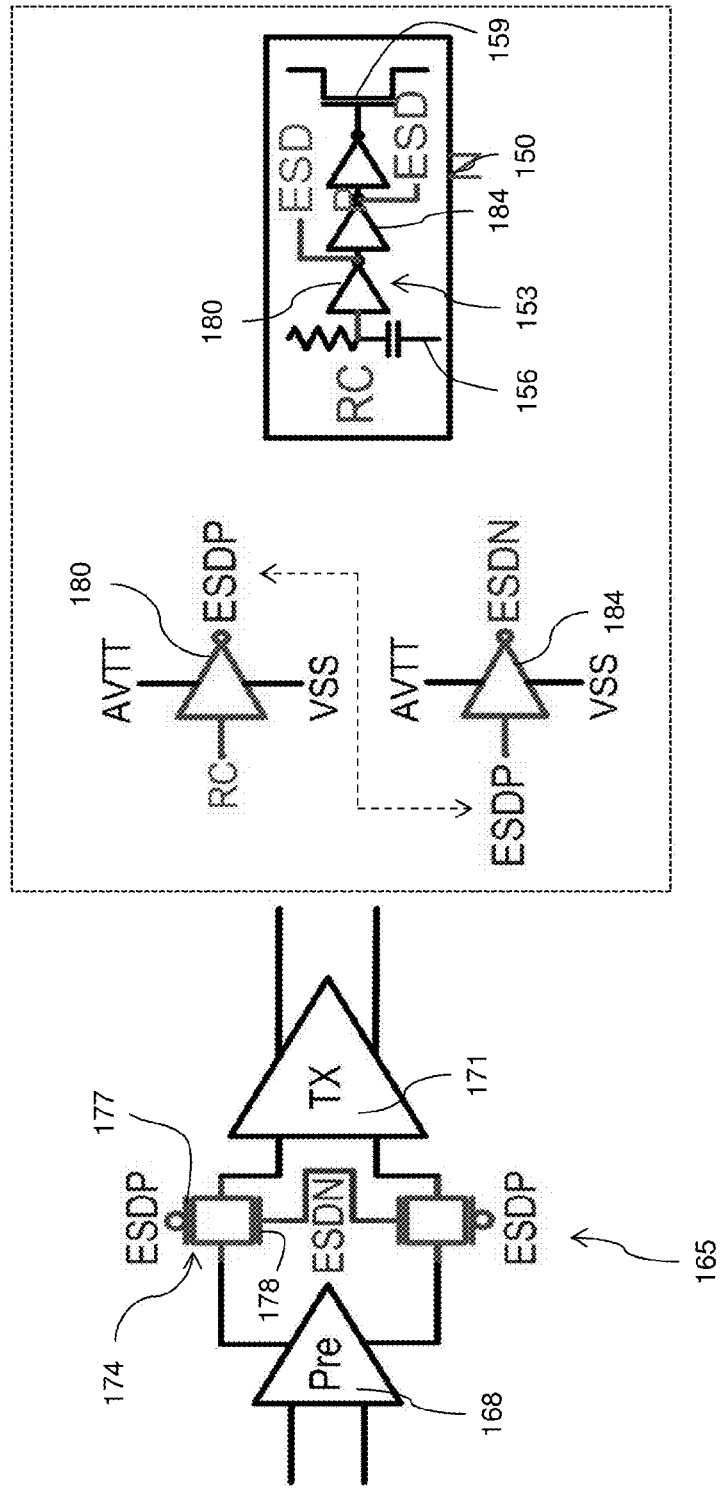
FIG. 6 is a schematic diagram illustrating embodiments herein.

Referring now to FIG. 6, another embodiment herein is illustrated. The embodiment shown in FIG. 6 includes pre-amplifier disconnection network, shown generally as 165. The disconnection network comprises a pre-amplifier 168 connected to a driver 171. The pre-amplifier 168 is similar in function to the pre-amplifiers 103, 106 (TXN2, TXP2) described above. Driver 171 is similar in function to the first driver 57 (TXN) and the second driver 58 (TXP) described above. A CMOS pass gate 174, comprising a PFET device 177 connected in parallel to an NFET device 178 is located between an output of the pre-amplifier 168 and an input to the driver 171.

A power-rail clamp circuit 150, as described above, provides control signals to the pass gate 174. In this embodiment, when an ESD event occurs, the first inverter 180 of the inverter network 153 provides a positive control signal to the PFET device 177. The output of the first inverter 180 is fed to the second inverter 184, and the second inverter 184 of the inverter network 153 provides a negative control signal to the NFET device 178.

Figure 7:
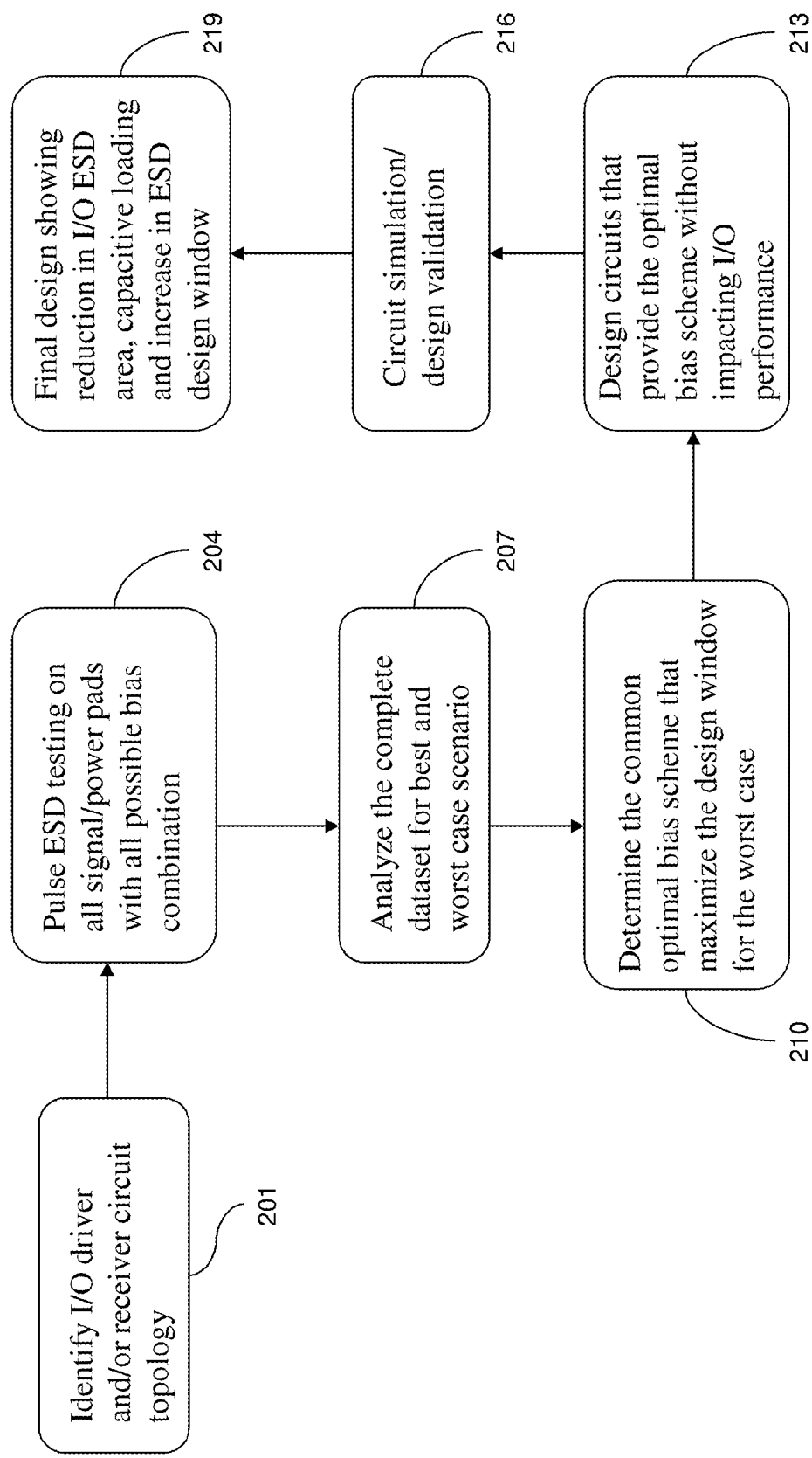
FIG. 7 is a flow diagram illustrating embodiments herein.

In order to determine optimum biasing for each ESD event as described above, the circuit can be evaluated according to the method shown in FIG. 7. First, at 201, the I/O driver and/or receiver circuit topology is identified. Then, at 204, pulse ESD testing is conducted on all signal pads and power pads with all possible bias combinations. Next, at 207, the complete results dataset from 207 is analyzed for best case and worst-case scenarios. Then, at 210, the common optimal bias scheme that maximizes the design window for the worst-case scenario is determined. At 213, a circuit can be designed that provides the optimal bias scheme without influencing I/O performance. At 216, the circuit is simulated for design validation. Finally, at 219, a final circuit design is obtained showing a reduction in I/O ESD area and capacitive loading, and an increase in ESD design window.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described herein with reference to flowchart illustrations and/or block diagrams of methods, apparatus (systems) and computer program products according to embodiments herein. It will be understood that each block of the flowchart illustrations and/or two-dimensional block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 8:
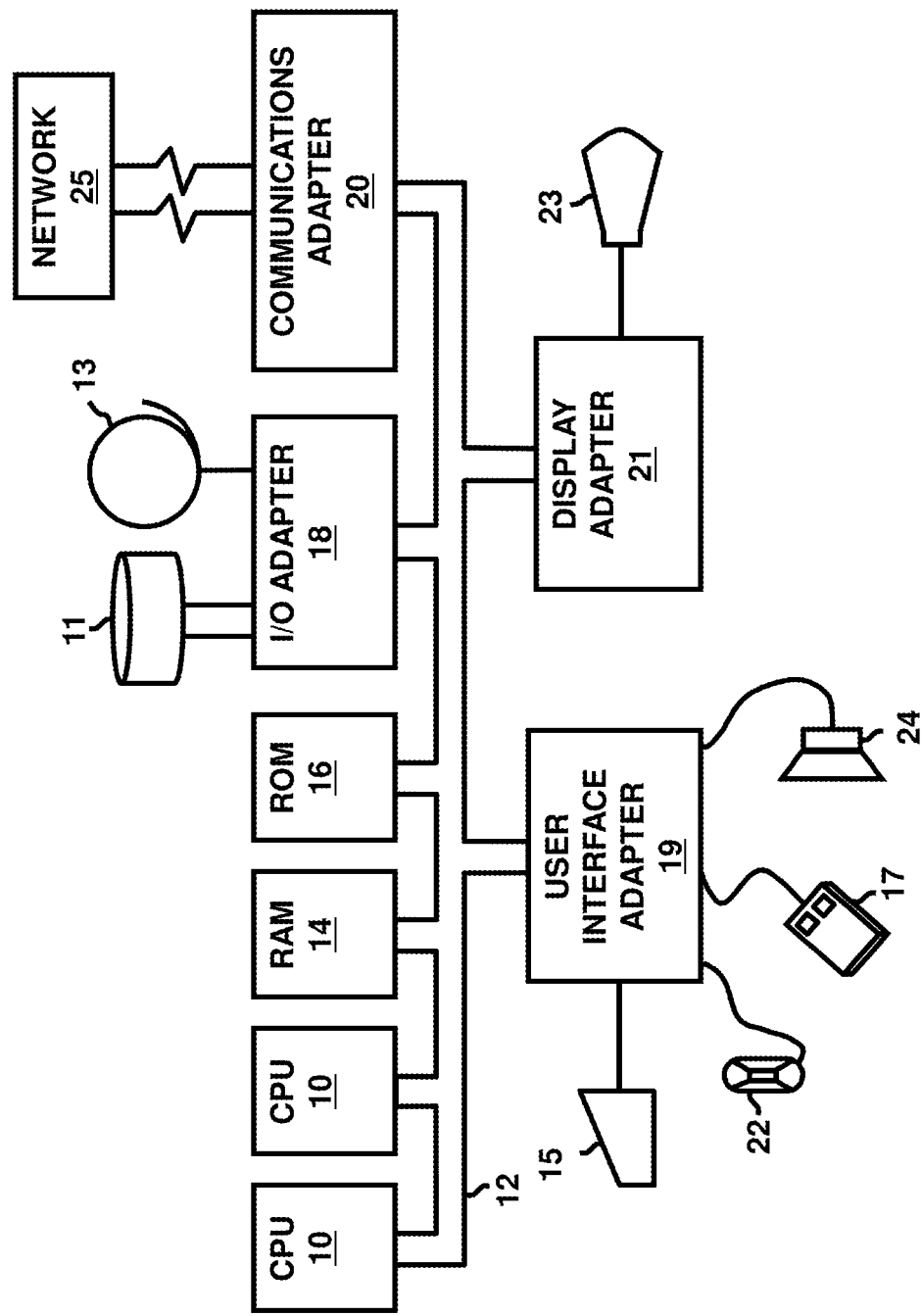
FIG. 8 is a schematic diagram of a hardware system according to embodiments herein.

A representative hardware environment for practicing the embodiments herein is depicted in FIG. 8. This schematic drawing illustrates a hardware configuration of an information handling/computer system in accordance with the embodiments herein. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments herein. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23, which may be embodied as an output device such as a monitor, printer, or transmitter, for example.

The flowchart and block diagrams in the Figures illustrate the architecture, functionality, and operation of possible implementations of systems, methods, and computer program products according to various embodiments herein. In this regard, each block in the flowchart or block diagrams may represent a module, segment, or portion of code, which comprises one or more executable instructions for implementing the specified logical function(s). It should also be noted that, in some alternative implementations, the functions noted in the block might occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

Within a transistor, the semiconductor (or channel region) is positioned between a conductive "source" region and a similarly conductive "drain" region and when the semiconductor is in a conductive state, the semiconductor allows electrical current to flow between the source and drain. A "gate" is a conductive element that is electrically separated from the semiconductor by a "gate oxide" (which is an insulator) and current/voltage within the gate changes the conductivity of the channel region of the transistor.

A positive-type transistor "P-type transistor" uses impurities such as boron, aluminum or gallium, etc., within an intrinsic semiconductor substrate (to create deficiencies of valence electrons) as a semiconductor region. Similarly, an "N-type transistor" is a negative-type transistor that uses impurities such as antimony, arsenic or phosphorous, etc., within an intrinsic semiconductor substrate (to create excessive valence electrons) as a semiconductor region.

Generally, transistor structures are formed by depositing or implanting impurities into a substrate to form at least one semiconductor channel region, bordered by shallow trench isolation regions below the top (upper) surface of the substrate. A "substrate" herein can comprise any material appropriate for the given purpose (whether now known or developed in the future) and can comprise, for example, Si, SiC, SiGe, SiGeC, other III-V or II-VI compound semiconductors, or organic semiconductor structures, etc. The "shallow trench isolation" (STI) structures are well known to those ordinarily skilled in the art and are generally formed by patterning openings/trenches within the substrate and growing or filling the openings with a highly insulating material (this allows different active areas of the substrate to be electrically isolated from one another).

For purposes herein, a "semiconductor" is a material or structure that may include an implanted impurity that allows the material to sometimes be a conductor and sometimes be an insulator, based on electron and hole carrier concentration. As used herein, "implantation processes" can take any appropriate form (whether now known or developed in the future) and can comprise, for example, ion implantation, etc.

The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of SiO2 and Si3N4, and metal oxides like tantalum oxide. The thickness of dielectrics herein may vary contingent upon the required device performance.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments herein have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A current mode logic (CML) driver, comprising:
a first output pad connected to a first voltage pad;
a second output pad connected to said first voltage pad;
a first driver connected to said first output pad and said first voltage pad;
a second driver connected to said second output pad and said first voltage pad;
a first electrostatic discharge (ESD) circuit connected to said first voltage pad, said first output pad, and said first driver; and
a second ESD circuit connected to said first voltage pad, said second output pad, and said second driver,
said first ESD circuit dynamically biasing said first driver toward a voltage of said first voltage pad and a voltage of said first output pad when an ESD event occurs at said first output pad, and
said second ESD circuit dynamically biasing said second driver toward said voltage, of said first voltage pad and a voltage of said second output pad when an ESD event occurs at said second output pad.

2. The CML driver of claim 1, further comprising:
a top bias transistor connected to said first driver and said second driver;
a bottom bias transistor connected to said top bias transistor;
a second voltage pad connected to said top bias transistor and to said bottom bias transistor;
a third ESD circuit connected to said top bias transistor and to said bottom bias transistor; and
a fourth ESD circuit connected to said bottom bias transistor and to said second voltage pad.

3. The CML driver of claim 2, said third ESD circuit dynamically biasing said top bias transistor toward a voltage of said second voltage pad when an ESD event occurs at said second voltage pad, and
said fourth ESD circuit dynamically biasing said bottom bias transistor toward said voltage of said second voltage pad when an ESD event occurs at said second voltage pact.

4. The CML driver of claim 1, said first driver, said second driver, said top bias transistor, and said bottom bias transistor comprising NFET devices.

5. The CML driver of claim 1, further comprising:
a first pre-amplifier connected to said first driver;
a second pre-amplifier connected to said second driver;
a first transistor connected to said first pre-amplifier and said first voltage pad;
a second transistor connected to said second pre-amplifier and said first voltage pad;
a first ESD-controlled inverter connected to a gate of said first transistor; and
a second ESD-controlled inverter connected to a gate of said second transistor,
said first ESD controlled inverter dynamically biasing said first transistor to disconnect said first pre-amplifier from said first voltage pad when an ESD event occurs at said first output pad, and
said second ESD controlled inverter dynamically biasing said second transistor to disconnect said second pre-amplifier from said first voltage pad when an ESD event occurs at said second output pad.

6. The CML driver of claim 5, further comprising:
a fifth ESD circuit connected to said first transistor and said first pre-amplifier, said fifth ESD circuit dynamically biasing said first pre-amplifier toward said voltage of said first voltage pad when an ESD event occurs at said first output pad, and
a sixth ESD circuit connected to said second transistor and said second pre-amplifier said sixth ESD circuit dynamically biasing said second pre-amplifier toward said voltage of said first voltage pad when an ESD event occurs at said second output, pad.

7. The CML driver of claim 5, said first pre-amplifier and said second pre-amplifier comprising NFET devices.

8. The CML driver of claim 5, said first transistor and said second transistor comprising PMOS devices.

9. The CML driver of claim 5, further comprising:
a top pre-amp bias transistor connected to said first pre-amplifier, said second pre-amplifier, and to said second voltage pad;
a bottom pre-amp bias transistor connected to said top pre-amp bias transistor and said second voltage pad;
a seventh ESD circuit connected to said top pre-amp bias transistor and to said second voltage pad; and
an eighth ESD circuit connected to said bottom pre-amp bias transistor and to said second voltage pad.

10. The CML driver of claim 9, said top pre-amp bias transistor and said bottom pre-amp bias transistor comprising NFET devices.

11. An integrated circuit, comprising:
a current mode logic (CML) driver, comprising:
a first output pad connected to a first voltage pad;
a second output pad connected to said first voltage pad;
a first driver connected to said first output pad and said first voltage pad; and
a second driver connected to said second output pad and said first voltage pad;
a first pre-amplifier connected to said first driver;
a second pre-amplifier connected to said second driver;
a first transistor connected to said first pre-amplifier and said first voltage pad;
a second transistor connected to said second pre-amplifier and said first voltage pad;
a first ESD-controlled inverter connected to a gate of said first transistor; and
a second ESD-controlled inverter connected to a gate of said second transistor,
said first ESD controlled inverter dynamically biasing said first transistor to disconnect said first pre-amplifier from said first voltage pad when an ESD event occurs at said first output pad, and
said second ESD controlled inverter dynamically biasing said second transistor to disconnect said second pre-amplifier from said first voltage pad when an ESD event occurs at said second output pad.

12. The integrated circuit of claim 11, said first driver, said second driver, said first pre-amplifier, and said second pre-amplifier comprising NFET devices.

13. The integrated circuit of claim 11, said first transistor and said second transistor comprising PMOS devices.

14. The integrated circuit of claim 11, further comprising:
a first ESD circuit connected to said first transistor and said first pre-amplifier, said first ESD circuit dynamically biasing said first pre-amplifier toward said voltage of said first voltage pad when an ESD event occurs at said first output pad, and
a second ESD circuit connected to said second transistor and said second pre-amplifier, said second ESD circuit dynamically biasing said second pre-amplifier toward said voltage of said first voltage pad when an ESD event occurs at said second output pad.

15. The integrated circuit of claim 11, further comprising:
a top pre-amp bias transistor connected to said first pre-amplifier, said second pre-amplifier, and to a second voltage pad;
a bottom pre-amp bias transistor connected to said top pre-amp bias transistor and said second voltage pad;
a third ESD circuit connected to said top pre-amp bias transistor and to said second voltage pad; and
a fourth ESD circuit connected to said bottom pre-amp bias transistor and to said second voltage pad.

16. The integrated circuit of claim 15, said top pre-amp bias transistor and said bottom pre-amp bias transistor comprising NFET devices.

17. The integrated circuit of claim 11, further comprising:
a fifth electrostatic discharge (ESD) circuit connected to said first voltage pad, said first output pad, and said first driver; and
a sixth ESD circuit connected to said first voltage pad, said second output pad, and said second driver,
said fifth ESD circuit dynamically biasing said first driver toward a voltage of said first voltage pad and a voltage of said first output pad when an ESD event occurs at said first output pad, and
said sixth ESD circuit dynamically biasing said second driver toward said voltage of said first voltage pad and a voltage of said second output pad when an ESD event occurs at said second output pad.

18. The integrated circuit of claim 11, further comprising:
a top bias transistor connected to said first driver and said second driver;
a bottom bias transistor connected to said top bias transistor;
a second voltage pad connected to said top bias transistor and to said bottom bias transistor;
a seventh ESD circuit connected to said top bias transistor and to said bottom bias transistor; and
an eighth ESD circuit connected to said bottom bias transistor and to said second voltage pad.

19. The integrated circuit of claim 18, said seventh ESD circuit dynamically biasing said top bias transistor toward a voltage of said second voltage pad when an ESD event occurs at said second voltage pad, and
said eighth ESD circuit dynamically biasing said bottom bias transistor toward said voltage of said second voltage pad when an ESD event occurs at said second voltage pad.

20. The integrated circuit of claim 18, said top pre-amp bias transistor and said bottom pre-amp bias transistor comprising NFET devices.

\* \* \* \* \*